United States Patent
Kim et al.

(10) Patent No.: US 7,947,985 B2
(45) Date of Patent: May 24, 2011

(54) THIN FILM TRANSISTOR ARRAY SUBSTRATE AND MANUFACTURING METHOD THEREOF

(75) Inventors: Dae-Cheol Kim, Suwon-si (KR); Woong-Kwon Kim, Cheonan-si (KR); Sang-Youn Han, Cheonan-si (KR); In-Woo Kim, Suwon-si (KR); Ho-Jun Lee, Anyang-si (KR); Byeong-Jae Ahn, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/435,773

(22) Filed: May 5, 2009

(65) Prior Publication Data
US 2009/0309101 A1 Dec. 17, 2009

(30) Foreign Application Priority Data
Jun. 13, 2008 (KR) ......... 10-2008-0055926
Nov. 5, 2008 (KR) ......... 10-2008-0109513

(51) Int. Cl.
*H01L 27/14* (2006.01)
(52) U.S. Cl. ...... 257/72; 257/59; 257/258; 257/E29.151
(58) Field of Classification Search ............ 257/59, 257/72, 258, E29.151
See application file for complete search history.

(56) References Cited

U.S. PATENT DOCUMENTS
7,012,658 B2 * 3/2006 Sawasaki et al. ......... 349/43
2005/0168664 A1 * 8/2005 Chae et al. ......... 349/38

* cited by examiner

*Primary Examiner* — Tan N Tran
(74) *Attorney, Agent, or Firm* — Cantor Colburn LLP

(57) ABSTRACT

A thin film transistor array substrate and its manufacturing method are disclosed. A thin film transistor (TFT) includes a gate electrode formed on a substrate, and source and drain electrodes formed on the gate electrode and separated from each other. A common line made of the same material as the gate electrode is formed on the substrate. A storage capacitor includes a storage electrode connected with a storage electrode line and a pixel electrode formed on the storage electrode. The storage electrode and the pixel electrode are formed by patterning a transparent conductive film, and accordingly, light can be transmitted through the region where the storage capacitor is formed to thus increase an aperture ratio.

8 Claims, 16 Drawing Sheets

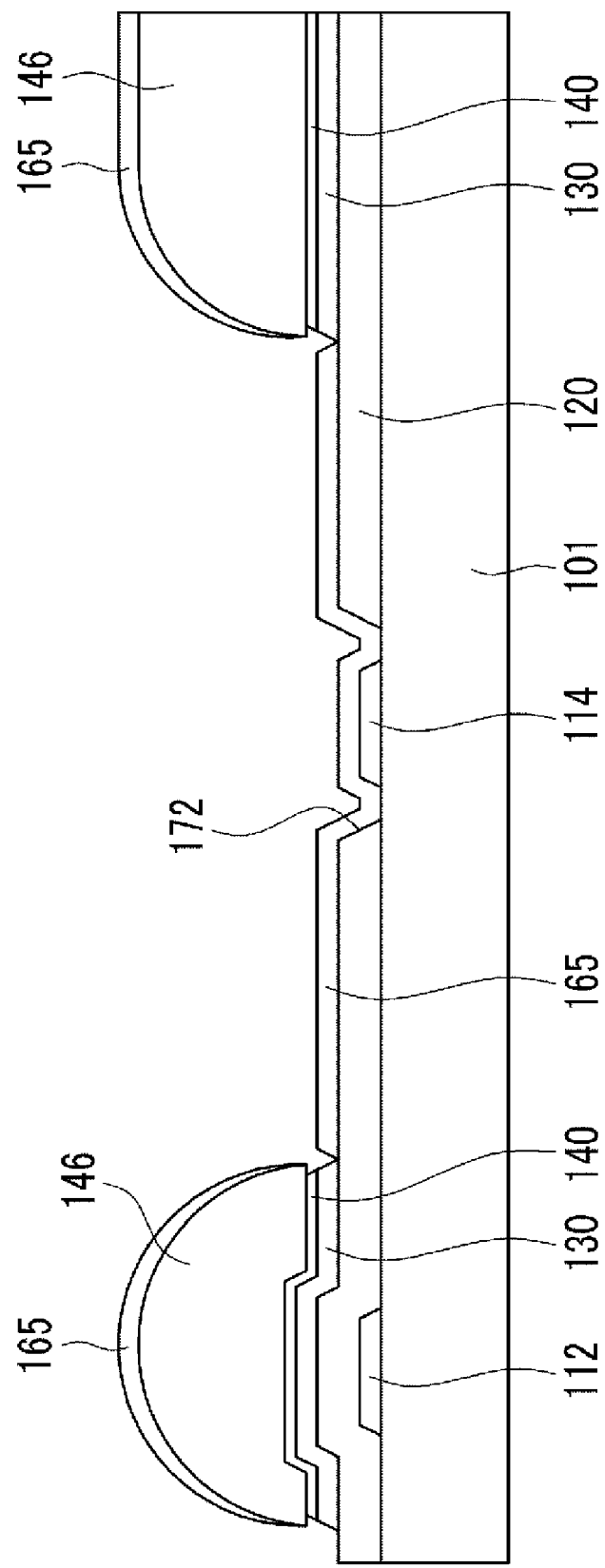

THIN FILM TRANSISTOR ARRAY SUBSTRATE AND MANUFACTURING METHOD THEREOF

This application claims priority to Korean Patent Application No. 10-2008-0055926 filed on Jun. 13, 2008, and to Korean Patent Application No. 10-2008-0109513 filed on Nov. 5, 2008, and all the benefits accruing therefrom under 35 U.S.C. 119, the contents of which are incorporated herein by reference in their entirety.

BACKGROUND OF THE INVENTION (a) Field of the Invention

The present invention relates to a thin film transistor array substrate and its manufacturing method.

(b) Description of the Related Art

In general, display devices, such as a liquid crystal display (LCD) or an organic light-emitting device, that display images include substrates on which a plurality of pixel areas are defined. The pixel areas refer to a minimum unit for displaying an image, and the plurality of pixel areas are defined to be individually discriminated in each display device.

Each of the plurality of pixel areas includes a thin film transistor so as to be independently driven. As the TFTs operate, a certain voltage is applied to pixel electrodes and light is applied from a light source to display an image.

An area ratio of a region to the entire area of a single pixel area, where light is transmitted, is called an aperture ratio.

An array substrate of the LCD includes a storage capacitor to maintain the voltage that has been applied to a liquid crystal capacitor until the next signal. In this respect, in order to secure the same capacitance of the storage capacitor according to increases in the resolution and driving frequency of the display substrates, the area of the storage capacitor should increase. However, in the related art, increase in the area of the storage capacitor formed of an opaque conductive layer causes a reduction in the aperture ratio.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention provides a thin film transistor (TFT) array substrate and its manufacturing method having the advantage of preventing degradation of an aperture ratio by forming a storage capacitor electrode as a transparent conductive layer, and being capable of suppressing generation of haze in the transparent conductive layer which may otherwise be caused by use of a high temperature deposition, by forming the storage capacitor electrode as the transparent conductive layer after formation of an active layer.

In addition, the present invention provides a TFT array substrate that can eliminate a storage capacitance difference between pixels. Further, the present invention provides a TFT array substrate that can prevent delay of a signal of a common voltage transmission line due to contact resistance between a surrounding common line and a surrounding storage electrode.

In an embodiment, a thin film transistor (TFT) array substrate includes: an insulation substrate; a common line and a gate line formed on the insulation substrate; a data line insulatedly crossing the gate line; a TFT including a semiconductor layer, a gate electrode connected with the gate line and overlapping with the semiconductor layer in an insulated state, a source electrode connected with the data line and being in contact with the semiconductor layer, and a drain electrode facing the source electrode on the semiconductor layer; a pixel electrode connected with the TFT; and a storage electrode connected with the common line, formed of a transparent conductive layer, and forming a storage capacitor with the pixel electrode.

The TFT array substrate may further include an insulating layer formed between the pixel electrode and the storage electrode.

The insulating layer may include a protection layer covering the TFT and made of an inorganic insulating material, and an organic insulating layer.

The area of the storage electrode may be smaller than that of the pixel electrode.

The pixel electrode may include a recess portion that is formed as a portion corresponding to the common line that is indented to be concave.

The TFT array substrate may further include a gate insulating layer formed on the common line and the gate line, insulating the semiconductor layer and the gate electrode of the TFT, and having a first contact hole exposing the common line, and the storage electrode is formed on the gate insulating layer and connected to the common line via the first contact hole.

The first contact hole may expose the common line and its peripheral insulation substrate, and the storage electrode may be in contact with an upper surface and a side surface of the common line and the insulation substrate.

The storage electrode and the data line may be separated by more than 3 μm.

The semiconductor layer may include an active layer and an ohmic-contact layer, the ohmic-contact layer may have the same planar shape as the data line, the source electrode, and the drain electrode, and remaining portions of the active layer other than the portion positioned between the source and drain electrodes may have the same planar shape as the ohmic-contact layer.

The first contact hole may expose a portion of an upper surface of the common line, and the storage electrode may be in contact with only the portion of the upper surface of the common line.

The TFT array substrate may further include a protection layer formed on the common line and the gate line and formed on the gate insulating layer insulating the semiconductor layer and the gate electrode of the TFT and on the TFT, and the storage electrode is formed on the protection layer and connected to the common line via the first contact hole penetrating the protection layer and the gate insulating layer.

In another embodiment, a method for manufacturing a TFT array substrate includes: forming a common line and a gate line on an insulation substrate; sequentially forming a gate insulating layer, an active layer, and an ohmic-contact layer on the common line and the gate line; forming a first contact hole penetrating the ohmic-contact layer, the active layer, and the gate insulating layer to expose the common line; forming a first photosensitive film pattern on the active layer and the ohmic-contact layer and etching the active layer and the ohmic contact layer; forming a transparent conductive layer on the first photosensitive film pattern and the gate insulating layer, and removing the first photosensitive film pattern to form a storage electrode connected with the common line; forming a data line, a source electrode, and a data electrode on the ohmic-contact layer; forming an interlayer insulating layer having a second contact hole exposing the drain electrode on the data line, the source electrode, the drain electrode, and the storage electrode; and forming a pixel electrode connected with the drain electrode on the interlayer insulating layer.

The forming of the data line, the source electrode, and the drain electrode on the ohmic-contact layer may include:

forming a conductor layer on the ohmic-contact layer; forming a photosensitive film on the conductor layer; exposing and developing the photosensitive film through a slit mask to form a second photosensitive film pattern having a first portion positioned to correspond to the data line, the source electrode, and the drain electrode and a second portion positioned to correspond to between the source electrode and the drain electrode, and having a thickness smaller than the first portion; etching the conductor layer, the ohmic-contact layer, and the active layer by using the second photosensitive film pattern as an etching mask; etching back the second photosensitive film pattern to form a third photosensitive film pattern without the second portion; and etching the conductor layer and the ohmic-contact layer by using the third photosensitive film pattern as an etching mask.

The forming of the interlayer insulating layer may include forming a protection layer made of an inorganic insulating material, and forming an organic insulating layer.

The interlayer insulating layer may be formed at a temperature of 300° C. or less.

Yet another embodiment of the present invention provides a method for manufacturing a TFT array substrate including: forming a common line and a gate line on an insulation substrate; forming a gate insulating layer on the common line and the gate line; forming an active layer and an ohmic-contact layer on the gate insulating layer; forming a data line, a source electrode, and a drain electrode on the ohmic-contact layer; forming a protection layer on the data line, the source electrode, and the drain electrode; forming a first contact hole penetrating the protection layer and the gate insulating layer to expose the common line; forming a storage electrode connected with the common line on the protection layer; forming an organic insulating layer on the storage electrode; forming a second contact hole penetrating the organic insulating layer and the protection layer to expose the drain electrode; and forming a pixel electrode connected with the drain electrode on the organic insulating layer.

The forming of the active layer and the ohmic-contact layer on the gate insulating layer and forming of the data line, the source electrode, and the drain electrode on the ohmic-contact layer include: forming the active layer, the ohmic-contact layer, and a conductor layer on the gate insulating layer; forming a photosensitive film on the conductor layer; exposing and developing the photosensitive film through a slit mask to form a second photosensitive film pattern having a first portion placed on the region corresponding to the data line, the source electrode, and the drain electrode and a second portion placed on the region corresponding to a region between the source electrode and the drain electrode and having a thickness smaller than that of the first portion; etching the conductor layer, the ohmic-contact layer, and the active layer by using the first photosensitive film pattern as an etching mask; etching back the first photosensitive film pattern to form a second photosensitive film pattern without the second portion; and etching the conductor layer and the ohmic-contact layer by using the second photosensitive film pattern as an etching mask.

In another embodiment, a TFT array substrate includes a display unit and a surrounding portion formed to surround the display unit. The TFT array substrate includes: a plurality of gate lines and a plurality of display unit common lines formed in the display unit; a plurality of data lines insulated from and crossing the gate lines; a TFT connected to the gate lines and the data lines and formed in each of the pixels that are defined by crossing of the gate lines and the data lines; a pixel electrode connected to the TFT; a display unit storage electrode that contacts the display unit common line, formed of a transparent conductive layer, and forming a storage capacitor with the pixel electrode; and a connection storage electrode that connects display unit storage electrodes of adjacent pixels.

The TFT array substrate further includes: a surrounding common line formed in the surrounding portion and connected to the display unit common line; a surrounding storage electrode formed on the surrounding common line and connected to the display unit storage electrode; and a common voltage transmission line formed in the surrounding portion and transmitting a common voltage signal to the surrounding common line. The common voltage transmission line contacts each of the surround common line and the surrounding storage electrode.

The surrounding storage electrode may be partially overlapped with the surrounding common line.

A gate insulation layer may be formed on the surrounding common line and the surrounding storage electrode, and the gate insulation layer may have a first surrounding contact hole that exposes the surrounding common line and a second surrounding contact hole that exposes the surrounding storage electrode.

The common voltage transmission line may contact the surrounding common line through the first surrounding contact hole, and may contact the surrounding storage electrode through the second surrounding contact hole.

The surrounding common line may be formed of the same material as that of the gate line, and may include AlNd.

The common voltage transmission line may be formed of the same material as that of the data line, and may include Mo.

The common voltage transmission line, the surrounding common line, the surrounding storage electrode, the first surrounding contact hole, and the second surrounding contact hole may be formed in a left surrounding portion and a right surrounding portion of the surrounding portion.

In the TFT array substrate and its manufacturing method according to the exemplary embodiments of the present invention, because the common line made of the same material as that of the gate electrode is on the same layer on which the gate electrode is formed and the storage electrode is formed to be connected with the common line to form the storage capacitor region together with the pixel electrode that corresponds to the storage electrode with the insulating layer interposed therebetween, a sufficient area of the storage capacitor can be secured without reducing an aperture ratio. In addition, because the storage electrode formed of the transparent conductive layer is formed after the gate insulating layer, the active layer, and the ohmic-contact layer are formed, haze in the transparent conductive layer due to a CVD high temperature process can be prevented.

BRIEF DESCRIPTION OF THE DRAWINGS

FIGS. 5A to 5I are cross-sectional views showing an exemplary method for manufacturing a TFT substrate according to an exemplary embodiment.

DESCRIPTION OF REFERENCE NUMERALS INDICATING PRIMARY ELEMENTS IN THE DRAWINGS

Figure 1:
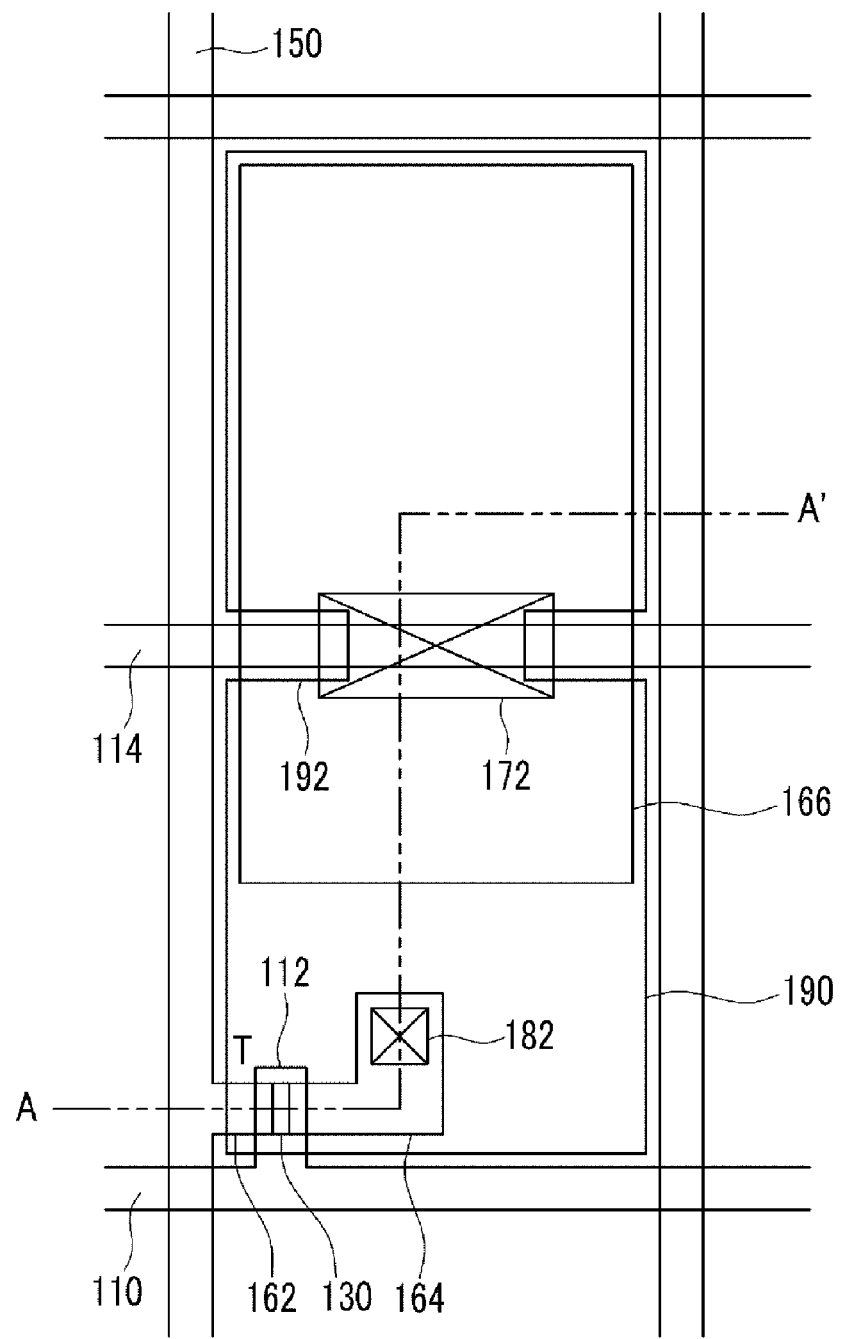
FIGS. 1 and 2 are respectively a layout view of a thin film transistor (TFT) array substrate and a cross-sectional view taken along line A-A' in FIG. 1 according to one exemplary embodiment.

110: gate line
166: display unit storage electrode
150: data line
214: surrounding common line
266: surrounding storage electrode
282: second surrounding contact hole
114: display unit common line
120: gate insulation layer
167: connection storage electrode
250: common voltage transmission line
281: first surrounding contact hole

DETAILED DESCRIPTION OF THE EMBODIMENTS

The present invention will be described more fully hereinafter with reference to the accompanying drawings, in which exemplary embodiments of the invention are shown. As those skilled in the art will understand, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Exemplary Embodiment 1

A thin film transistor (TFT) array substrate according to an exemplary embodiment will now be described in detail with reference to the accompanying drawings.

Figure 2:
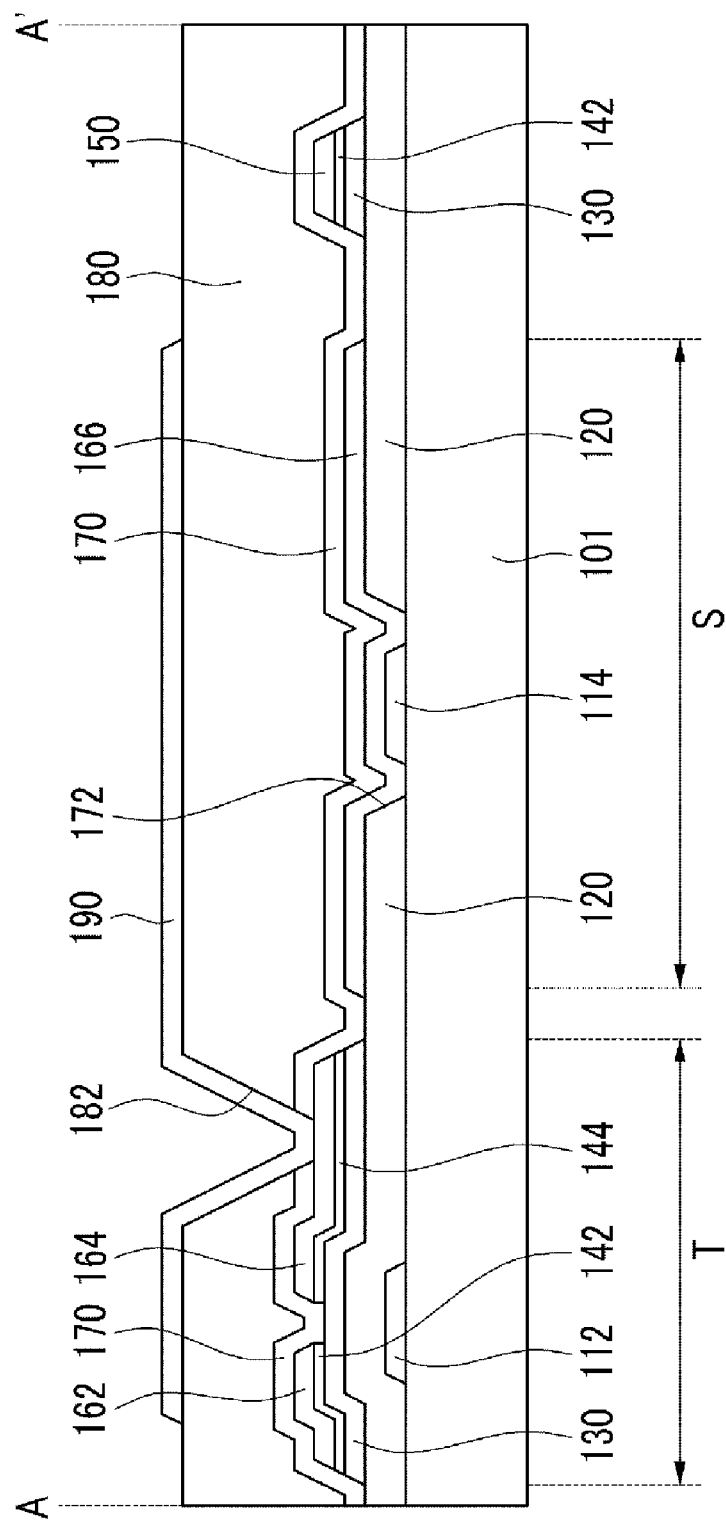

FIGS. 1 and 2 are respectively a layout view of a thin film transistor (TFT) array substrate and a cross-sectional view taken along line A-A' in FIG. 1 according to one exemplary embodiment.

With reference to FIGS. 1 and 2, the TFT array substrate according to the present exemplary embodiment includes gate lines 110 and data lines 150 formed on an insulation substrate 101. The gate lines 110 and the data lines 150 cross each other on the insulation substrate 101. A plurality of pixel areas are defined where the plurality of gate lines 110 and the plurality of data lines 150 cross each other. Each pixel area of the plurality of pixel areas has the same shape, and only a single pixel is illustrated in FIG. 1. The description below is based on a single exemplary pixel.

Each pixel area includes a TFT (T), a common line 114, a storage electrode 166, and a pixel electrode 190. The TFT (T) includes a gate electrode 112, a source electrode 162, a drain electrode 164, and semiconductor layers 130, 142, and 144. The gate electrode 112 is branched from the gate line 110, and the source electrode 162 is branched from the data line 150. The drain electrode 164 is separated from the source electrode 162, and formed on the same layer on which the source electrode 162 is formed. The semiconductor layers 130, 142, and 144 include an active layer 130 made of amorphous silicon and ohmic-contact layers 142 and 144 formed on the active layer 130. The ohmic contact layers 142 and 144 have substantially the same planar shape as that of the data line 150, the source electrode 162, and the drain electrode 164, and the active layer 130 has substantially the same planar shape as that of the ohmic-contact layers 142 and 144 except that its region corresponding to a channel portion between the source and drain electrodes 162 and 164 is connected.

The common line 114 is made of the same material as that of the gate electrode 112, and is formed separately from the gate electrode 112 on the same layer.

A gate insulating layer 120 made of silicon nitride film (SiNx) or a silicon oxide film ($SiO_2$) is formed on the gate line 110, the gate electrode 112, and the common line 114. The gate insulating layer 120 includes a contact hole 172, which exposes the insulation substrate 101, together with the common line 114.

A storage electrode 166 made of a transparent conductive material is formed on the gate insulating layer 120 such that it is separated from the TFT (T). The storage electrode 166 is connected with the common line 114 via the contact hole 172, and is partially in contact with the insulation substrate 101.

The semiconductor layers 130, 142, and 144 are formed on the gate insulating layer 120. The semiconductor layers 130, 142, and 144 include the active layer 130 made of amorphous silicon and the ohmic-contact layers 142 and 144 formed on the active layer 130.

The data line 150, the source electrode 162, and the drain electrode 164 made of a conductive material such as metal are formed on the ohmic contact-layers 142 and 144. The data line extends in a vertical direction to insulatedly cross the gate line 110 with the gate insulating layer 120 interposed therebetween to define the pixel area, and the source and drain electrodes 162 and 164 are spaced apart from each other based on the gate electrode 112 and face each other.

A protection layer 170 formed of an inorganic insulating layer such as a silicon nitride film (SiNx), a silicon oxide film ($SiO_2$), or the like, is formed on the data line 150, the storage electrode 166, and the source and drain electrodes 162 and 164, and an organic insulating layer 180 is formed on the protection layer 170. The protection layer 170 and the organic insulating layer 180 include a contact hole 182 exposing a portion of the drain electrode 164. Here, the protection layer 170 and the organic insulating layer 180 may be substituted with a single layer made of an inorganic or organic insulating material.

A pixel electrode 190 is formed on the organic insulating layer 180, connected with the drain electrode 164 via the contact hole 182, and forms a storage capacitor with the storage electrode 166 with the insulating layers 170 and 180 interposed therebetween. A portion of the pixel electrode 190 corresponding to the common line 114 is indented to form a recess portion 192.

Thus, in the present exemplary embodiment, the storage electrode 166 connected with the common line 114 is made of a transparent conductive material, and as a common voltage ($V_{com}$) signal is transferred to the common line 114, a storage capacitor is formed between the storage electrode 166 and the pixel electrode 190. Because the storage electrode 166 is transparent, even if the storage electrode 166 is increased as sufficient as necessary, the aperture ratio would not be degraded.

Exemplary Embodiment 2

Figure 3:
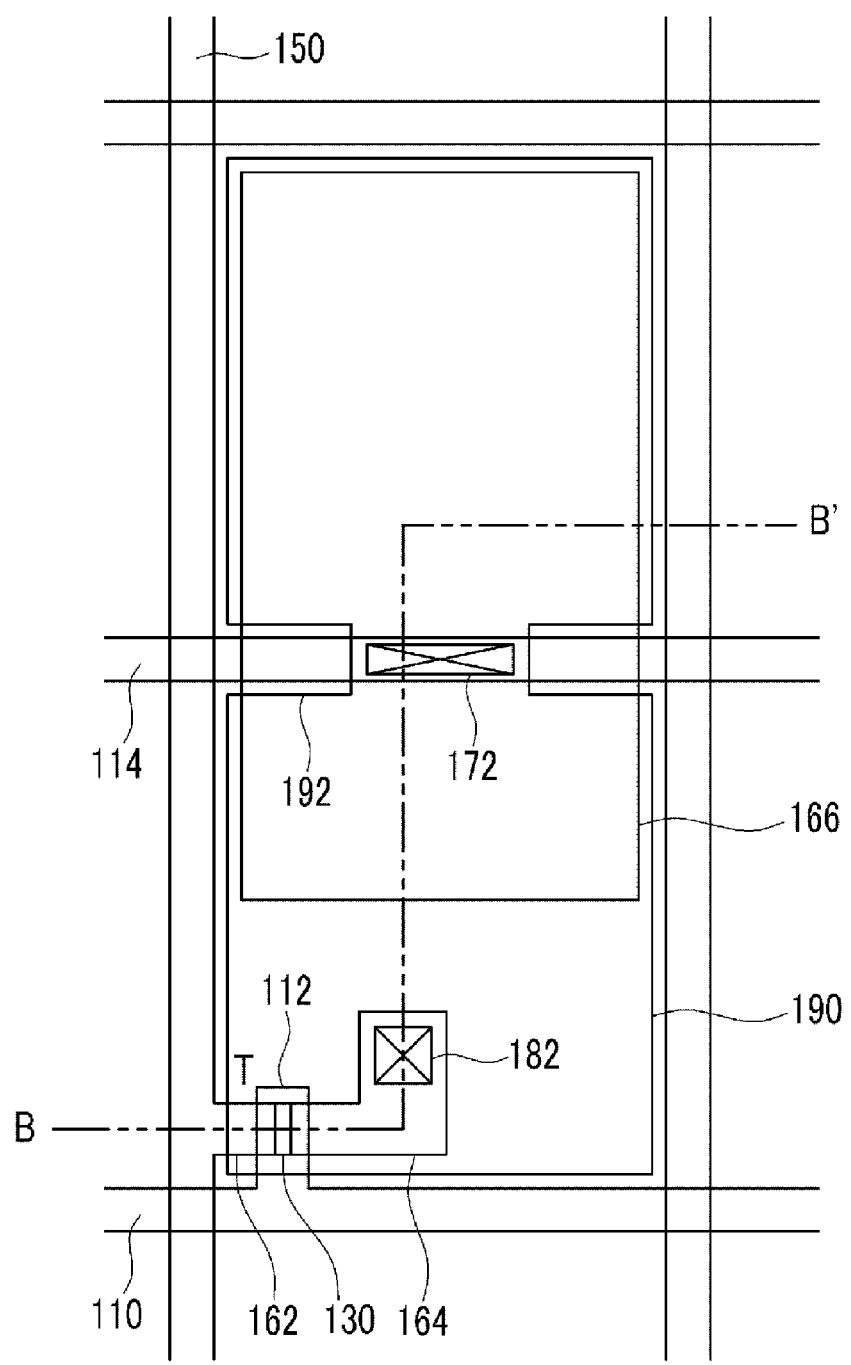
FIGS. 3 and 4 are respectively a layout view of an exemplary TFT array substrate and a cross-sectional view taken along line B-B' in FIG. 3 according to another exemplary embodiment.
Figure 4:
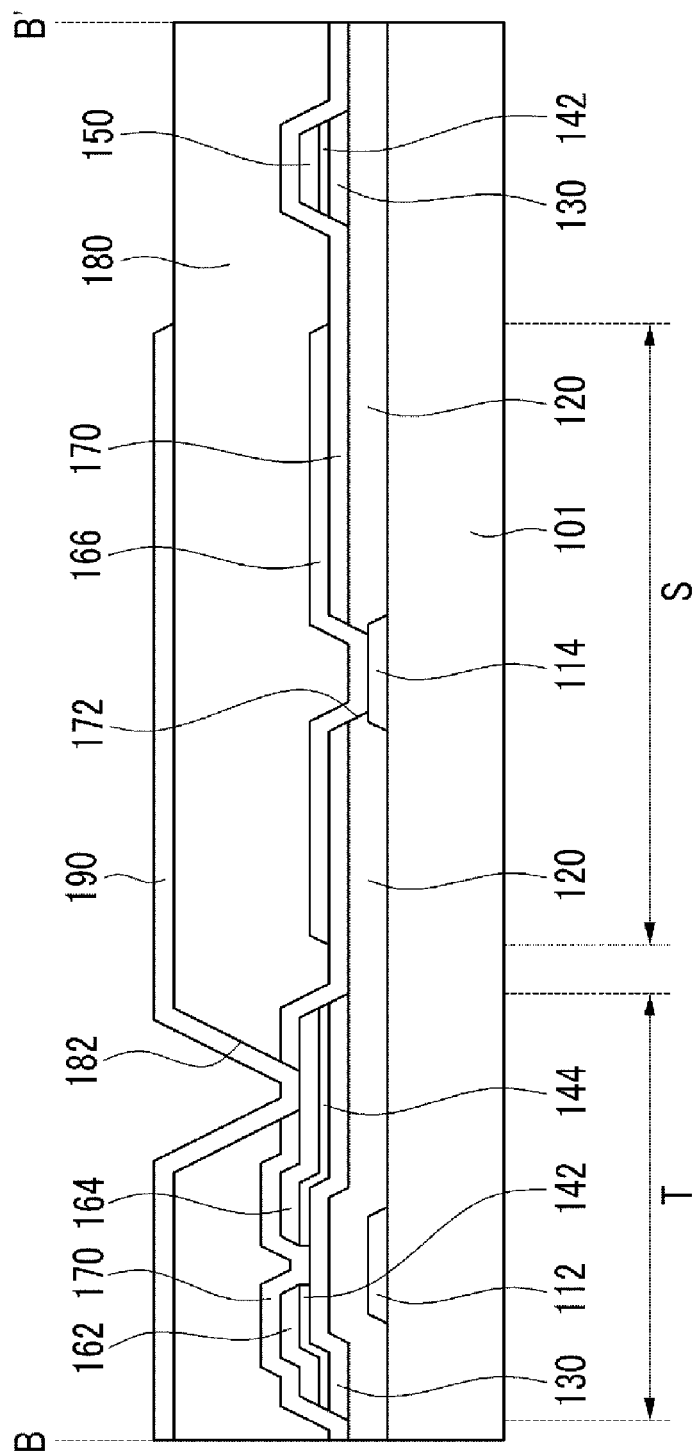

FIG. 3 is a layout view of the TFT array substrate according to another embodiment of the present invention, and FIG. 4 is a sectional view taken along line B-B' in FIG. 3.

The second exemplary embodiment is different from the first exemplary embodiment in that the storage electrode 166 is formed on the protection layer 170, the contact hole 172 exposing the common line 114 penetrates the gate insulating layer 120 and the protection layer 170, and the contact hole 172 exposes only the common line 114. The gate line 110 is formed on the insulation substrate 101, the gate insulating layer 120 is formed on the gate electrode 112 and the common line 114, and the active layer 130 and the ohmic-contact layers 142 and 144 are formed on the gate insulating layer 120.

The data line 150, the source electrode 162, and the drain electrode 164 are formed on the ohmic-contact layers 142 and 144, and the protection layer 170 is formed on the data line 150, the source electrode 162, and the drain electrode 164.

The contact hole 172 exposing a portion of an upper surface of the common line 114 is formed at the protection layer 170 and the gate insulating layer 120, and the storage electrode 166 formed of a transparent conductive layer is formed on the protection layer 270 and connected with the common line 114 via the contact hole 172.

The organic insulating layer 180 having the contact hole 182 exposing the drain electrode 164 is formed on the protection layer 170 and the storage electrode 166, and the pixel electrode 190 is formed on the organic insulating layer 180 to form a storage capacitor together with the storage electrode 166 with the organic insulating layer 180 interposed therebetween.

The second exemplary embodiment has the same effect as that of the first exemplary embodiment. Besides, because the storage electrode 166 is formed after formation of the protection layer 170, a high temperature process is not performed after the storage electrode 166 is formed with a transparent conductive material such as Indium Tin Oxide (ITO), Indium Zinc Oxide (IZO), or the like. Thus, the TFT array substrate is free from a haze deficiency that may be caused when a high temperature process is performed after formation of the storage electrode 166. In addition, because the distance between the pixel electrode 190 and the storage electrode 166 is reduced, the storage capacitor can be advantageously increased.

Exemplary Embodiment 3

FIGS. 5A to 5I are cross-sectional views showing a method for manufacturing a TFT substrate according to an exemplary embodiment of the present invention, which corresponds to the sections taken along line A-A' in FIG. 1.

Figure 5A:
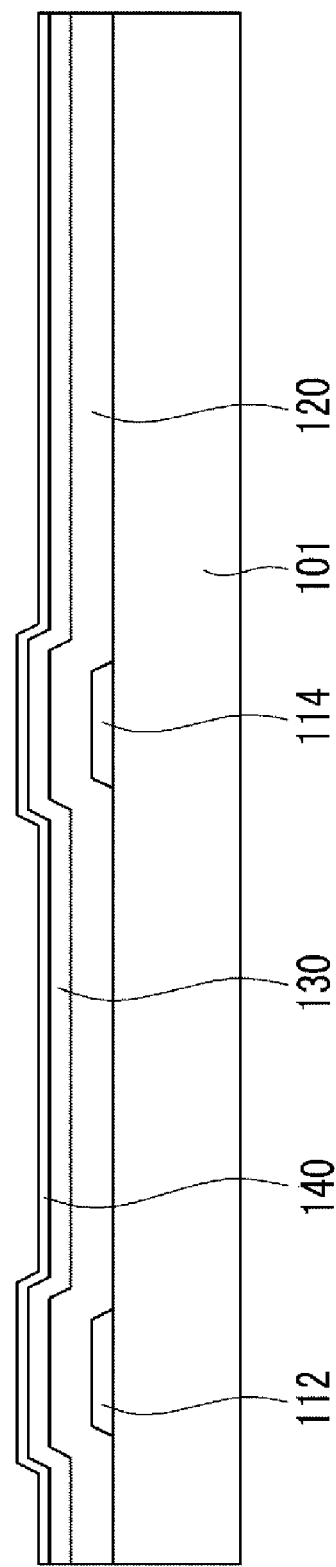

First, as shown in FIG. 5A, the gate line 110, the gate electrode 112, and the common line 114 made of a conductive material such as a metal are formed on the insulation substrate 101. The metal conductive material may include one, two, or more materials of the group consisting of Al, Mo, Cr, W, Ti, Ta, and Cu.

The gate insulating layer 120, the active layer 130, and the ohmic-contact layer 140 are sequentially formed on the gate line 110, the gate electrode 112, and the common line 114 through chemical vapor deposition (CVD). The gate insulating layer 120 is formed using one or more layers selected from the group consisting of an $SiN_x$ layer and an $SiO_2$ layer. The active layer 130 is formed by depositing a material such as amorphous silicon, and the ohmic-contact layer 140 may be formed by depositing amorphous silicon including impurities such as phosphor or boron.

Figure 5B:
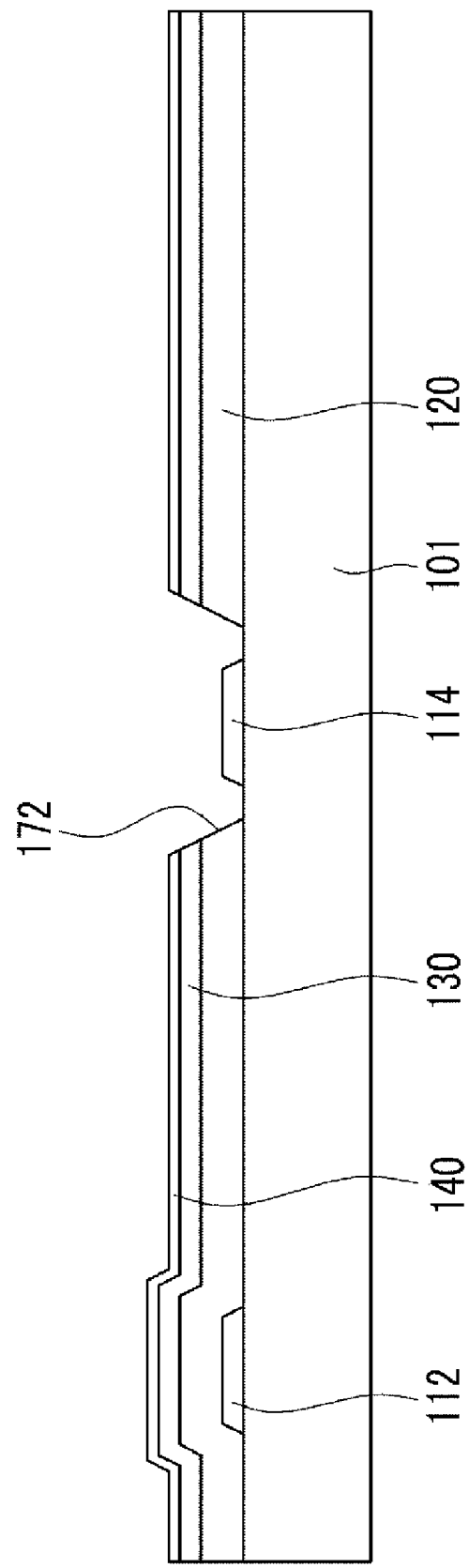

Next, as shown in FIG. 5B, the contact hole 172 exposing the common line 114 is formed. The process of forming the contact hole 172 may be performed such that a photosensitive film pattern is formed through photolithography, on which dry etching is then performed.

Figure 5C:
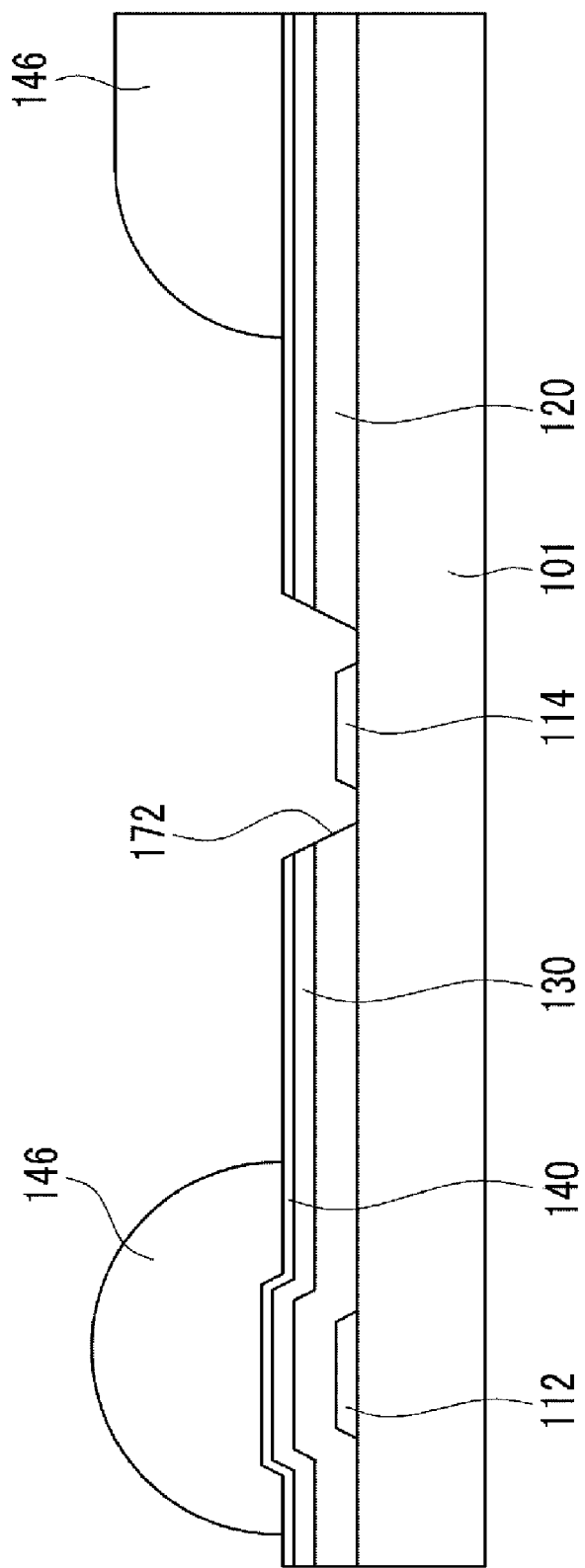

Subsequently, as shown in FIG. 5C, a lift-off photosensitive film pattern 146 is formed on the ohmic-contact layer 140. The lift-off photosensitive film pattern 146 is formed on regions other than a portion where the storage electrode 166 is to be formed. By leaving the lift-off photosensitive film pattern 146 on the TFT region (T), on the portion where the data line 150 is to be formed, and on the gate line 110, the lift-off photosensitive film pattern 146 may have a planar matrix form.

Figure 5D:
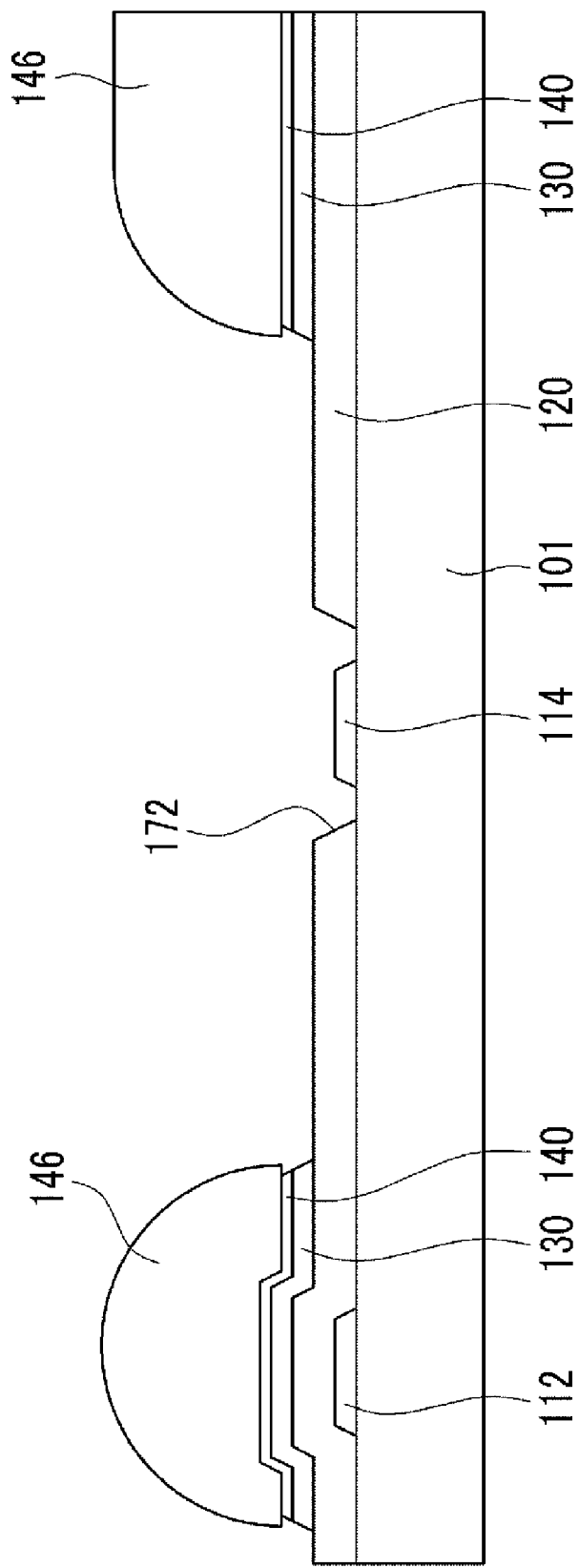

And then, as shown in FIG. 5D, the exposed ohmic-contact layer 140 and the active layer 130 are successively etched out by using the semiconductor forming a photosensitive film pattern 146 as an etching mask.

Thereafter, as shown in FIG. 5E, a transparent conductive material is deposited on the entire surface of the resulting structure to form a transparent conductive layer 165 on the photosensitive film pattern 146, the gate insulating layer 120, and the exposed common line 114. The transparent conductive layer 165 may be formed by a physical vapor deposition (PVD) method such as sputtering, of a transparent conductive material such as either ITO or IZO.

Figure 5F:
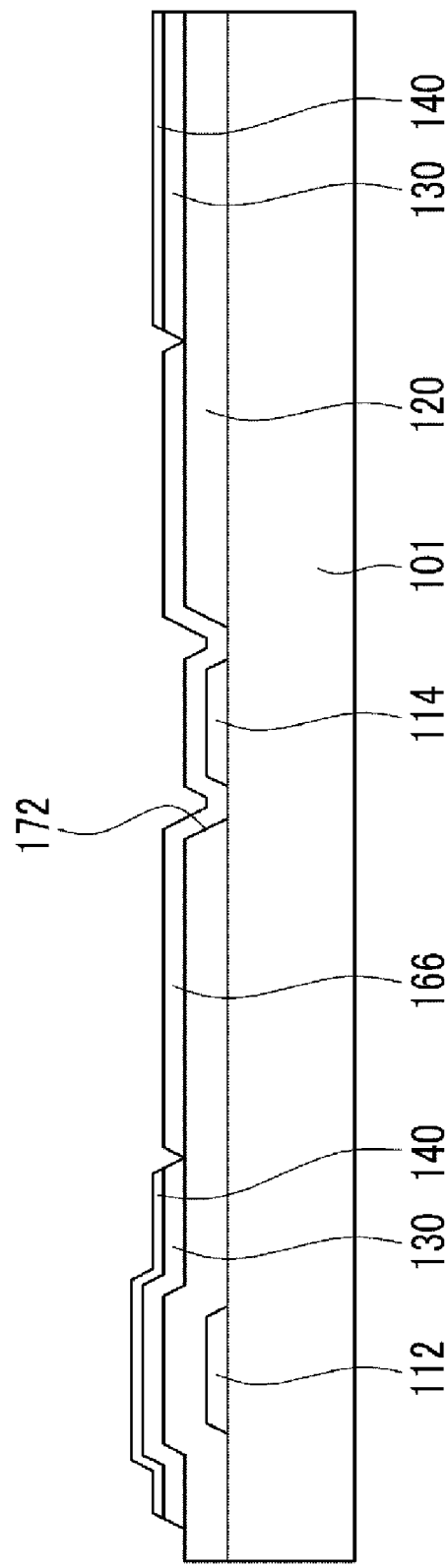

Subsequently, as shown in FIG. 5F, the photosensitive film pattern 146 is removed to remove the transparent conductive layer 165 formed on the photosensitive film pattern 146 (lift-off method). In this manner, the storage electrode 166 connected with the common line 114 is formed. In this case, in order to facilitate the lift-off, the active layer 130 may be partially dry-etched to form an undercut, before the transparent conductive layer 165 is formed. The use of the lift-off process advantageously shortens the fabrication time and reduces the fabrication costs by reducing the number of photolithography processes.

Figure 5G:
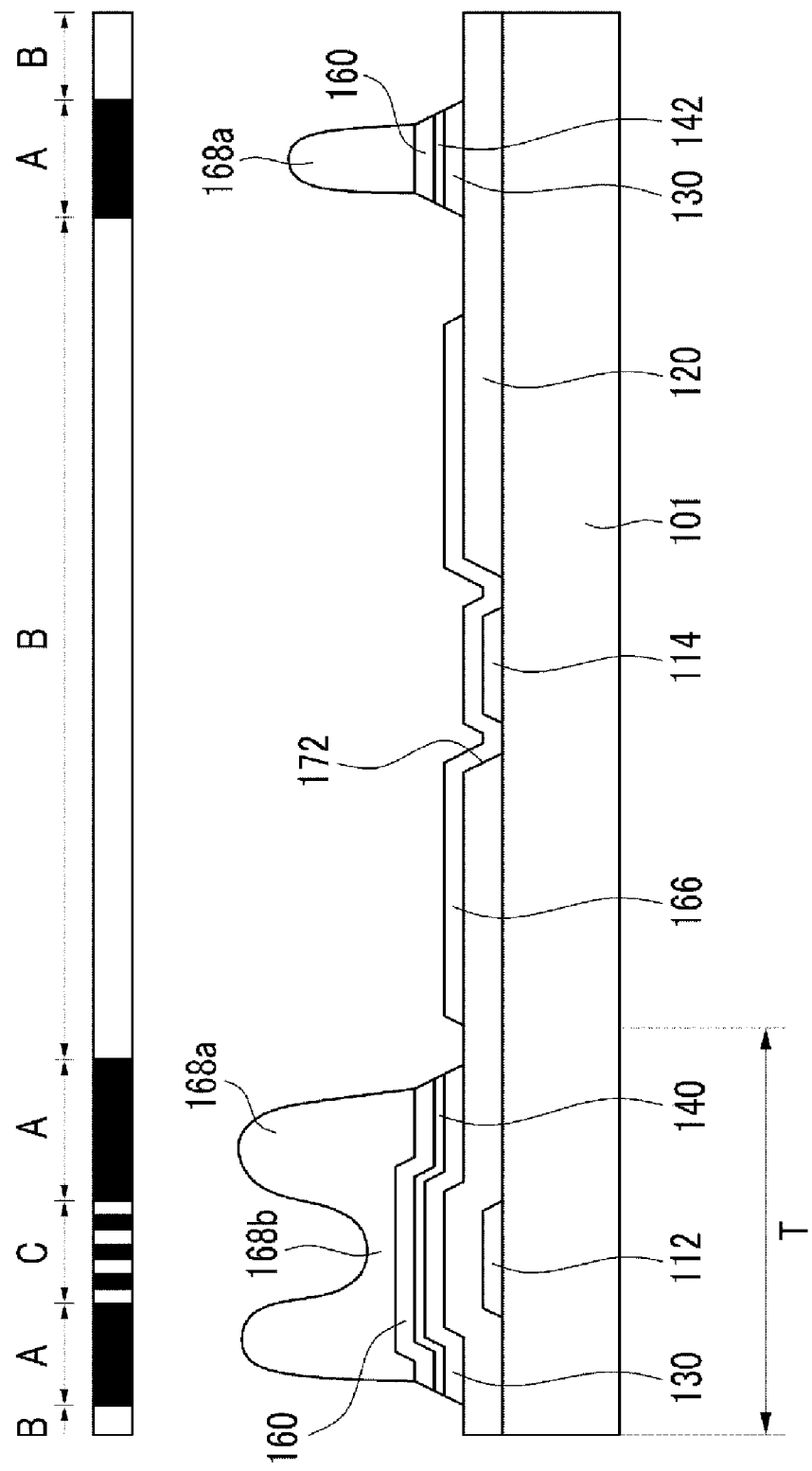

And then, as shown in FIG. 5G, a conductive material such as metal is deposited to form the conductor layer 160, and a photosensitive film is formed on the conductor layer 160. The conductor layer 160 may be formed to include one, two, or more materials selected from the group consisting of Al, Mo, Cr, W, Ti, Ta, Au, and Cu.

Thereafter, the photosensitive film is exposed and developed by using a slit mask to form photosensitive film patterns 168a and 168b at the TFT region (T) and at the region where the data line 150 is to be formed. In this case, the slit mask is divided into three parts each having different light transmission characteristics. The part ('A' in FIG. 5G) corresponding to the regions where the source and drain electrodes 162 and 164 and the data line 150 are to be formed does not allow light to be transmitted therethrough. The part ('C' in FIG. 5G) between the source and drain electrodes 162 and 164 corresponding to a channel of the TFT (T) allows only some light to be transmitted therethrough, and the part ('B' in FIG. 5G) allows light to be completely transmitted therethrough. The photosensitive film exposed by using such a slit mask is developed to form the photosensitive film patterns 168a and 168b each having a different thickness. The photosensitive film pattern 168a is thicker at the regions where the source and drain electrodes 162 and 164 and the data line 150 are to be formed, and the photosensitive film pattern 168b formed at the region between the source and drain electrodes 162 and 164 is thinner, and the photosensitive film at the other remaining region has been completely removed.

Subsequently, the conductor layer 160 and the lower ohmic-contact layer 140 and active layer 130 are removed by etching, using the photosensitive film patterns 168a and 168b as etching masks.

Figure 5H:
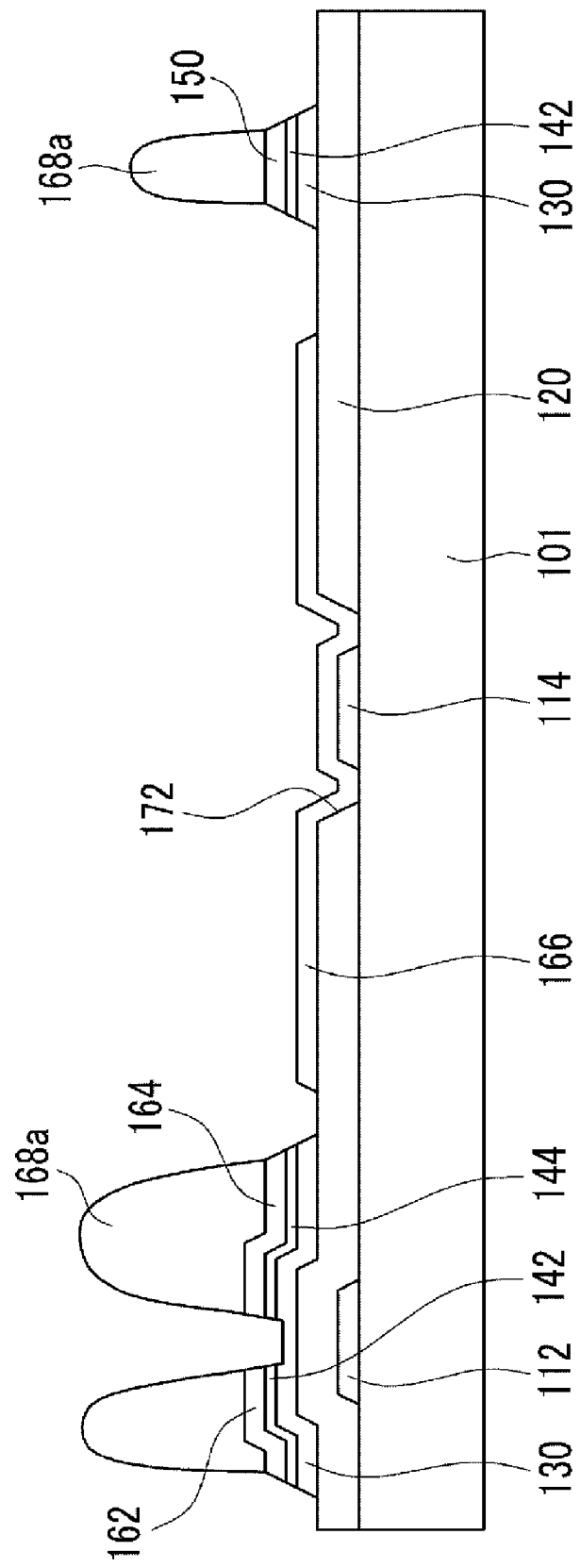

Then, as shown in FIG. 5H, the photosensitive film patterns 168a and 168b are etched back to remove the thinner photosensitive film pattern 168b. In this case, the photosensitive film pattern 168b may be removed by using oxygen plasma, in which the thicker photosensitive film pattern 168a would also be etched to have a smaller (reduced) thickness.

Thereafter, the exposed conductor layer 160 and the lower ohmic-contact layer 140 are removed by using the photosensitive film patterns 160a as etching masks to complete the source and rain electrodes 162 and 164 and the ohmic contact layers 142 and 144. Here, because the ohmic-contact layer 140 should be completely removed to prevent a defect, the ohmic-contact layer 140 is over-etched, and in this case, because the ohmic-contact layer 140 and the active layer 130 do not have an etching selectivity, the upper portion of the active layer 130 may be partially removed.

In this case, the storage electrode 166 previously formed in consideration of a misalignment margin in the photolithography process may be separated by a minimum of 3 μm from the data line 150.

Figure 5I:
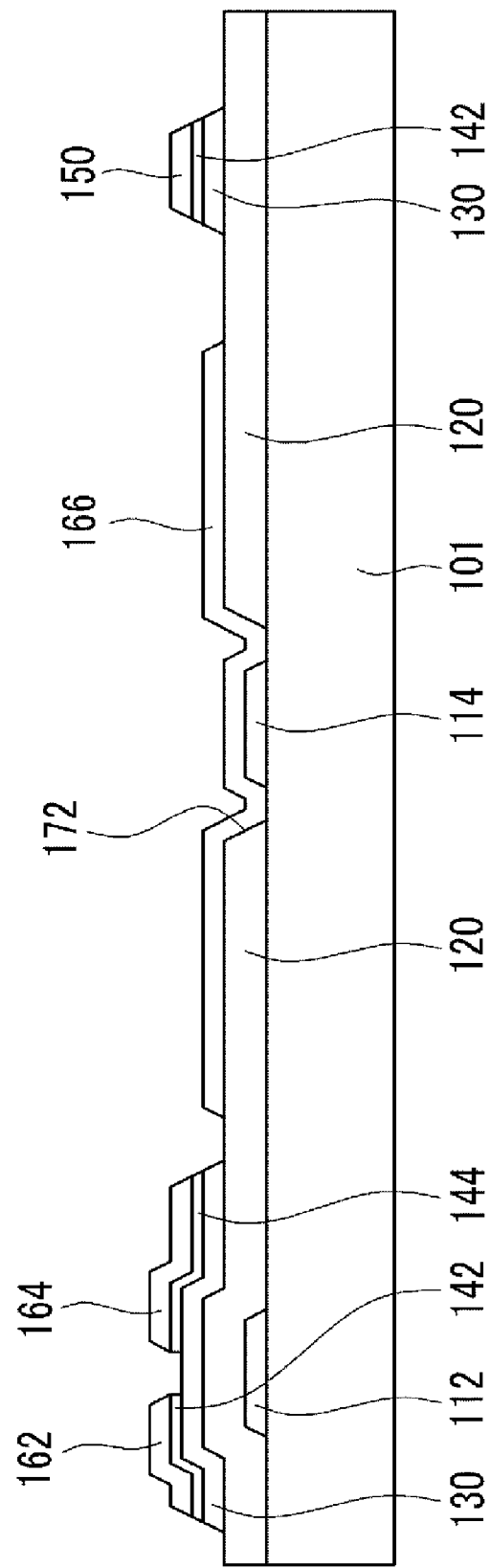

Then, as shown in FIG. 5I, the photosensitive film pattern 168a is removed.

Thereafter, as shown in FIG. 2, the protection layer 170 and the organic insulating layer 180 are formed on the entire surface of the insulation substrate 101 with the TFT (T), the storage electrode 166, and the data line 150 formed thereon, and the contact hole 182 exposing a portion of the drain electrode 164 is formed through a photolithography process. Subsequently, a transparent conductive layer connected with the drain electrode 164 via the contact hole 182 is formed, and then, the pixel electrode 190 is formed through a photolithography process.

Thus, in the recent trend in which the size of the pixel area is reduced according to the increase in the resolution of screen display devices, if the area of the storage capacitor were increased to secure a sufficient charging capacity under the same driving conditions, the aperture ratio would be degraded. However, when the storage electrode and the pixel electrode are formed by using the transparent conductive layer as disclosed in the present invention, degradation of the aperture ratio can be prevented. In addition, because the storage electrode formed of the transparent conductive layer is formed after forming the triple-layer made up of the gate insulating layer, the semiconductor layer, and the ohmic-contact layer, degradation of the transmittance that would otherwise be generated by a haze phenomenon at the transparent conductive layer is prevented because the temperature for forming the triple-layer is 300° C. or higher.

Exemplary Embodiment 4

The method for manufacturing the TFT array substrate according to the second exemplary embodiment will now be described with reference to FIG. 4.

First, the gate line 110, the gate electrode 112, and the common line 114 are formed with a conductive material such as a metal on the insulation substrate 101, on which the gate insulating layer 120, the active layer 130, the ohmic-contact layer 140, and a data conductor layer are then sequentially formed.

Next, a photosensitive film is formed on the data conductor layer and exposed and developed by using a slit (half-tone) mask to form photosensitive film patterns at the TFT region (T) and the region where the data line 150 is to be formed. In this case, the photosensitive film pattern is similar to the photosensitive film patterns 168a and 168b as shown in FIG. 5G. The data conductor layer, the lower ohmic-contact layer and the active layer are etched by using the photosensitive film patterns to form the source and drain electrodes 162 and 164, the ohmic-contact layers 142 and 144, and the active layer 130. This process is the same as that described above with reference to FIGS. 5G and 5I according to the exemplary embodiment 3.

Thereafter, the protection layer 170 is formed on the entire surface of the insulation substrate 101 with the TFT (T) and the data line 150 formed thereon, and then, the contact hole 172 exposing a portion of the common line 114 is formed through a photolithography process.

Subsequently, a transparent conductive layer connected with the common line 114 via the contact hole 172 is formed, and then, the storage electrode 166 is formed through a photolithography process.

Then, the organic insulating layer 180 is formed on the storage electrode 166 and the protection layer 170, on which a photolithography process is performed to form the contact hole 182 exposing a portion of the drain electrode 164.

Thereafter, a transparent conductive layer connected with the drain electrode 164 via the contact hole 182 is formed, on which a photolithography process is performed to form the pixel electrode 190.

The techniques of the present invention can be applicable to a manufacturing process of an active display device such as an organic light emitting device or the like as well as the LCD.

Exemplary Embodiment 5

Figure 6:
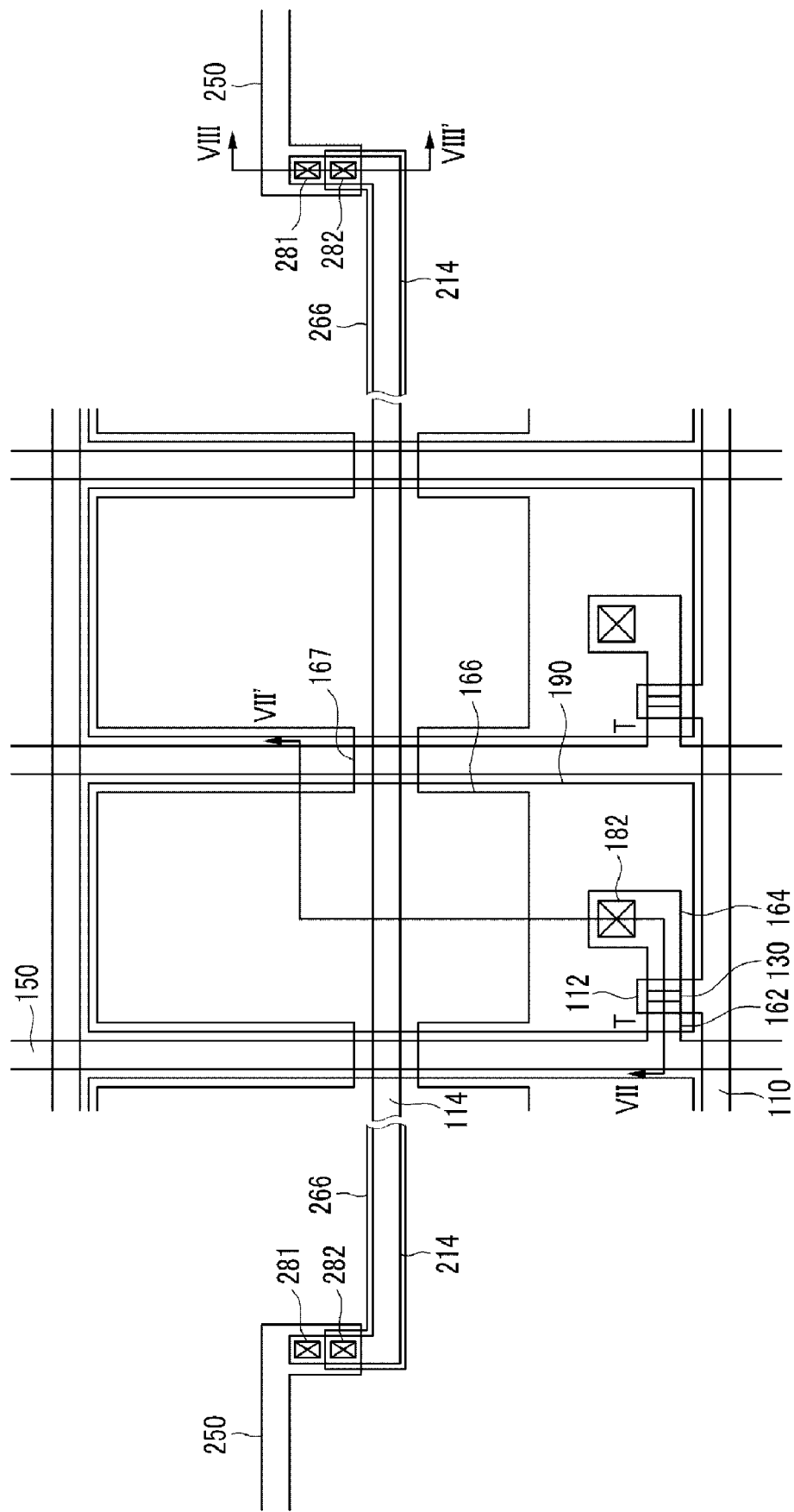
FIG. 6 is a layout view of an exemplary TFT array substrate according to another embodiment.
Figure 7:
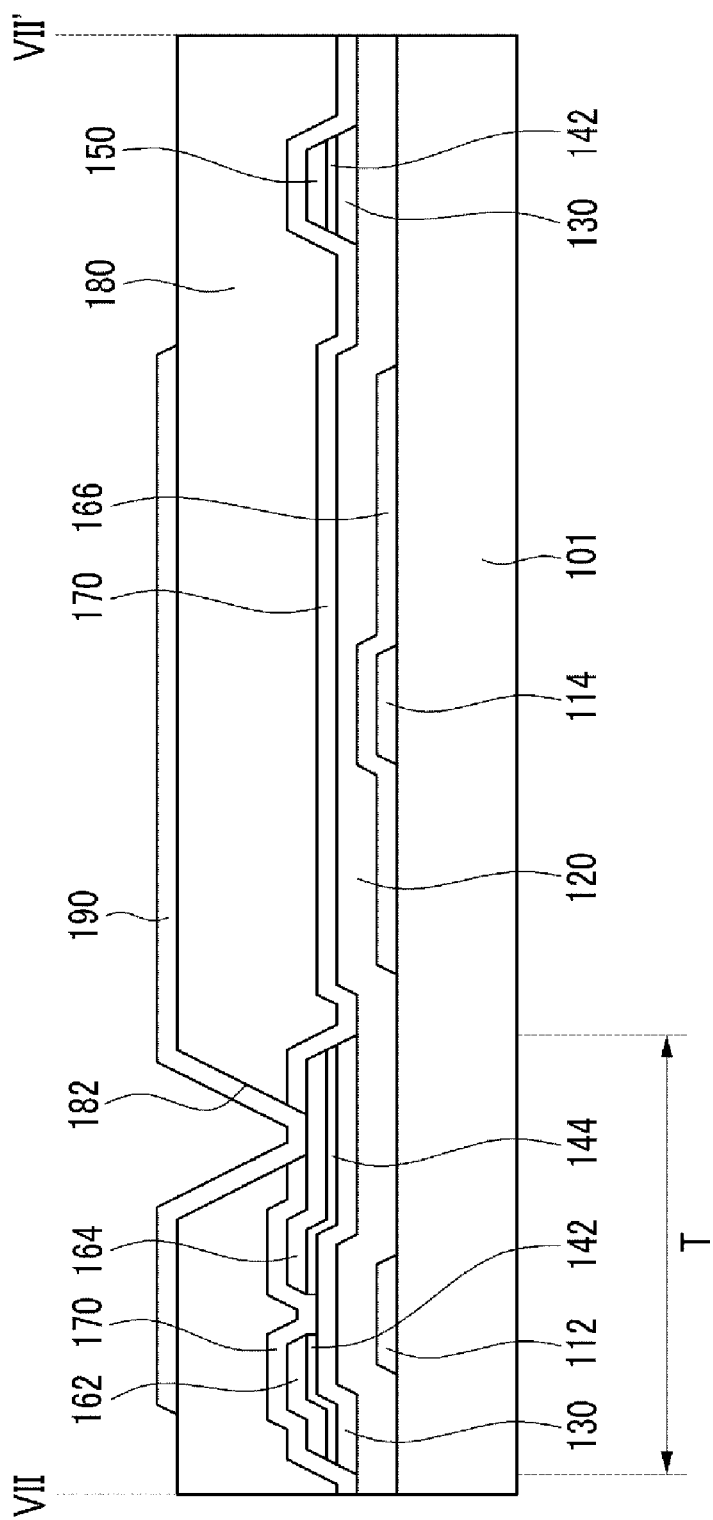
FIG. 7 is a cross-sectional view of FIG. 6, taken along the line VII-VII.
Figure 8:
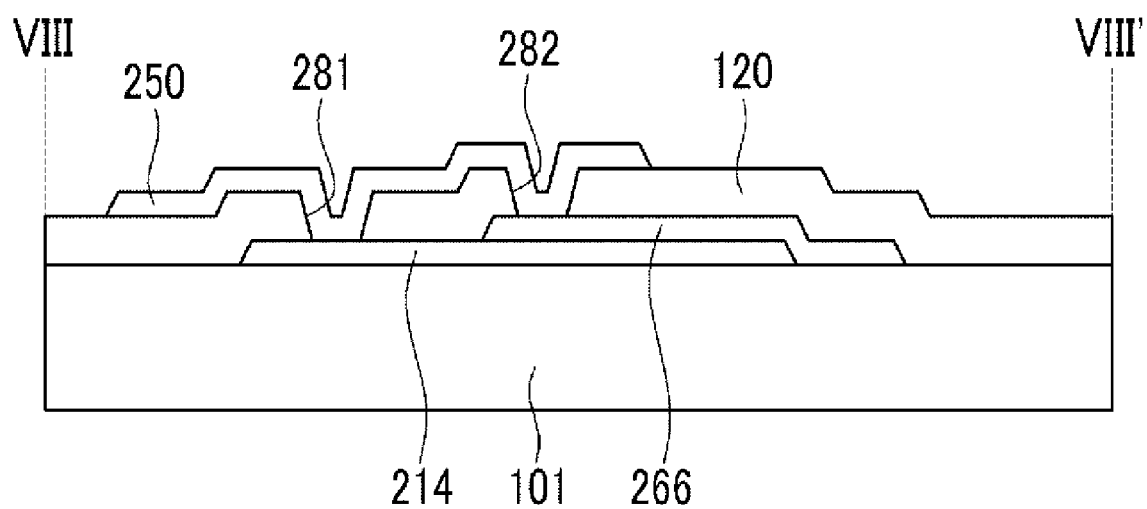
FIG. 8 is a cross-sectional view of FIG. 6, taken along the line VIII-VIII.

FIG. 6 is a layout view of a TFT array substrate according to another embodiment, FIG. 7 is a cross-sectional view of FIG. 6 taken along the line VII-VII', and FIG. 8 is a cross-sectional view of FIG. 6 taken along the line VIII-VIII'. Specifically, FIG. 7 shows a cross-sectional view of a display unit that displays an image, and FIG. 8 shows a cross-sectional view of a surrounding area formed to surround the display unit.

First, a structure of a display unit of the TFT array substrate will be described with reference to the drawings As shown in FIG. 6 and FIG. 7, a TFT array substrate according to the present exemplary embodiment includes a plurality of gate lines 110 and a plurality of date lines 150 formed on an insulation substrate 101. The gate lines 110 and the data lines 150 cross each other on the insulation substrate 101 and define a plurality of pixels. Each of the plurality of pixels has the same shape. FIG. 6 shows a single pixel, which will be described as a reference.

Each pixel includes a TFT T, a display unit common line 114, a display unit storage electrode 166, and a pixel electrode 190. The TFT T includes a gate electrode 112, a source electrode 162, a drain electrode 164, and semiconductor layers 130, 142, and 144. The gate electrode 112 is formed by branching from the gate line 110, and the source electrode 162 is formed by branching from the data line 150. The drain electrode 164 is disposed at a distance from the source electrode 162, and is formed on the same layer on which the source electrode 162 is formed. The semiconductor layers 130, 142, and 144 have a structure in which an active layer 130 formed of amorphous silicon and ohmic-contact layers 142 and 144 doped with impurities are sequentially formed. The ohmic-contact layers 142 and 144 have substantially the same planar shape as the data line 150, the source electrode 152, and the drain electrode 164, and remaining portions of the active layer 130 other than the portion (channel unit) connected between the source electrode 162 and the drain electrode 164 have substantially the same planar shape as the ohmic-contact layers 142 and 144.

The display unit common line 144 is made of the same material as that of the gate electrode 112, and is formed at a distance from the gate electrode 112 on the same layer on which the gate electrode 112 is formed. The gate line 110, the gate electrode 112, and the display unit common line 114 are each made of a metal such as Al, an Al alloy, Ag, an Ag alloy, Cr, Ti, Ta, or Mo. In the exemplary embodiment, the gate line 110, the gate electrode 112, and the display unit common line 114 are made of AlNd.

On the insulation substrate 110 and the display unit common line 114, the display unit storage electrode 116 that is made of a transparent conductive material such as ITO and is disposed at a distance from the TFT T is formed. The display unit storage electrode 116 directly contacts the display unit common line 114, and also contacts the insulation substrate 101.

A connection storage electrode 167 that connects a display unit storage electrode 166 of each pixel is provided between adjacent pixels. The connection storage electrode 167 is overlapped with the display unit common line 114, and is partially overlapped with the data line 150.

The gate insulation layer 120 that is made of silicon nitride $SiN_x$ or silicon oxide $SiO_2$ is formed on the gate line 110, the gate electrode 112, and the display unit storage electrode 166. In addition, the semiconductor layers 130, 142, and 144 are formed on the gate insulation layer 120. The semiconductor layers 130, 142, and 144 have a structure in which the active layer 130 that is made of amorphous silicon and the ohmic-contact layers 142 and 144 that are doped with impurities are sequentially formed.

On the ohmic-contact layers 142 and 144, the data line 150 formed of a conductive material such as a metal, the source electrode 162, and the drain electrode 164 are formed. The data line 150 is extended in a vertical direction to intersect the gate line 110, interposing the gate insulation layer 120 therebetween such that a pixel area is defined, and the source electrode 162 and the drain electrode 162 are formed to face each other at a distance from each other with respect to the gate electrode 112.

It is preferable that the data line 150 is made of a refractory metal such as Mo, Cr, Ti, or an alloy thereof, and may have a multi-layer structure including a refractory metal layer and a low resistance conductive layer. In the exemplary embodiment, Mo is used for the data line 150.

A passivation layer 170 formed of an inorganic insulation layer such as silicon oxide SiNx or silicon nitride SiO2 is formed on the data line 150, the display unit storage electrode 166, and the source and drain electrodes 162 and 164, and an organic insulation layer 180 is formed on the passivation layer 170. The passivation 170 and the organic insulation layer 180 have a contact hole 182 that partially exposes the drain electrode 164. Here, the passivation layer 170 and the organic insulation layer 180 can be replaced with a single layer made of an inorganic or organic insulation material.

On the organic insulation layer 180, a pixel electrode 190 is formed. The pixel electrode 190 is connected to the drain electrode 164 through the contact hole 182, and forms a storage capacitor with the display unit storage electrode 166, interposing the insulation layers 120, 170, and 180 therebetween.

The display unit storage electrode 166 connected to the display unit common line 144 is formed of a transparent conductive material in the exemplary embodiment of the present invention, and the storage capacitor is formed between the display unit storage electrode 166 and the pixel electrode 190 as a signal of a common voltage $V_{com}$ is transmitted through the common line 114. In the present exemplary embodiment, the aperture ratio is not reduced even though the width of the storage electrode 166 is increased, since the storage electrode 166 is transparent.

When the display unit common line 114 and the display unit storage electrode 166 directly contact each other, contact resistance between the display unit common line 114 and the display unit storage electrode 166 is increased due to a natural oxide film formed between the AlNd that is a material forming the display unit common line 114 and ITO that is a material forming the display unit storage electrode 166. Further, the thicknesses of the natural oxide film of each pixel may be different from each other because the thickness of the natural oxide film disposed between the display unit common line 114 and the display unit storage electrode 166 may change according to the process, and in this case, the amount of charge supplied to the display unit storage electrode 166 also changes such that a stain failure can occur.

Therefore, the connection storage electrode 167 that connects the display unit storage electrode 166 of each pixel is formed according to the present embodiment so that the display unit storage electrodes 166 connected to the same display unit common line 114 are connected to each other. Therefore, a contact resistance difference is not generated between the display unit common line 114 and the display unit storage electrode 166 of the respective pixels connected to the same display unit common line 114. Accordingly, a stain failure due to the contact resistance difference between the display unit common line 114 and the display unit storage electrode 166 of each pixel can be eliminated. In addition, when the display unit storage electrodes 166 are connected to each other, contact resistance can be made in parallel, thereby reducing the overall contact resistance.

Next, a structure of the display unit of the TFT array substrate will be described with reference to the drawing.

As shown in FIG. 6 and FIG. 8, a surrounding common line 214 connected to the display unit common line 114 is formed in a surrounding portion of the TFT array substrate. The surrounding common line 214 is formed of the same material as that of the display unit common line 114 on the same layer on which the display unit common line 114 is formed. In the present exemplary embodiment, AlNd is used for the surrounding common line 214. A surrounding storage electrode 266 is formed along the surrounding common line 214 on the surrounding common line 214, and is partially overlapped with the surrounding common line 214. The surrounding storage electrode 266 directly contacts the surrounding common line 214.

The gate insulation layer 120 is formed on the surrounding common line 214, the surrounding storage electrode 266, and the insulation substrate 101 of the surrounding portion of the TFT array substrate. A first surrounding contact hole 281 that exposes the surrounding common line 214 and a second surrounding contact hole 282 that exposes the surrounding storage electrode 266 are formed in the gate insulation layer 120.

On the gate insulation layer 120 of the surrounding portion of the TFT array substrate, a common voltage transmission line 250 is formed to transmit a common voltage signal to the surrounding common line 214. The common voltage transmission line 250 is formed of the same material as that of the data line 150, and in the present exemplary embodiment, Mo is used as the common voltage transmission line 250. Such a common voltage transmission line 250 contacts the surrounding common line 214 through the first surrounding contact hole 281, and contacts the surrounding storage electrode 266 through the second surrounding contact hole 282.

Contact resistance between Mo forming the common voltage transmission line 250 and ITO forming the surrounding storage electrode 266 is 100,000 times lower than the contact resistance between AlNd forming the surrounding common line 214 and ITO forming the surrounding storage electrode 266.

Conventionally, the common voltage transmission line 250 is directly connected to the surrounding common line 214, the surrounding common line 214 is connected to the display unit common line 114, and the display unit common line 114 is connected to the display unit storage electrode 166 so that when the common voltage signal of the common voltage transmission line 250 is transmitted to the display unit storage electrode 166, the signal transmission is delayed due to large contact resistance between the display unit common line 114 and the display unit storage electrode 166.

However, as in the other exemplary embodiments, in the double-contact structure in which the common voltage transmission line 250 contacts the surrounding storage electrode 255 and the surrounding common line 214, the common voltage signal of the common voltage transmission line 250 is transmitted through a first path formed from the common voltage transmission line 250 through the surrounding common line 214 and the surrounding storage electrode 266 to the display unit storage electrode 166, and through a second path formed from the common voltage transmission line 250 through the surrounding storage electrode 266 to the display unit storage electrode 166 without passing through the surrounding common line 214. Therefore, when the contact resistance between the surrounding common line 214 and the surrounding storage electrode 266 is very large, a normal common voltage signal can be transmitted to the display unit storage electrode 166 through the second path without passing through the first path. Accordingly, delay of the signal of the common voltage transmission line 250 due to the contact resistance between the surrounding common line 214 and the surrounding storage electrode 166 can be prevented.

Meanwhile, since the surrounding storage electrode 266 added to the display unit storage electrode 166 causes resistance of the entire storage electrode to be increased, a signal delay occurs due to the common voltage signal so that a common voltage signal deviation is generated between a pixel in the left end portion of the TFT array substrate and a pixel in the right end portion of the TFT array panel. However, since the common voltage transmission line 250 according to the present exemplary embodiment has the double-contact structure in which the common voltage transmission line 250 contacts the surrounding common line 214 and the surrounding storage electrode 255, resistance of the surrounding common line 214 is low even though the overall resistance of the storage electrode is increased due to the surrounding storage electrode 266 so that the common voltage signal deviation between the left and right pixels of the TFT array substrate can be eliminated.

In addition, the common voltage transmission line 250 is connected to the pixels from left and right sides of the TFT array substrate, and therefore the double-contact structure of the common voltage transmission line 250 with the surrounding common line 214 and the surrounding storage electrode 266 is formed in left and right surrounding portions of the TFT array substrate.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array substrate comprising:
    an insulation substrate;
    a common line and a gate line formed on the insulation substrate;
    a data line insulatedly crossing the gate line;
    a TFT comprising a semiconductor layer, a gate electrode connected with the gate line and overlapping with the semiconductor layer in an insulated state, a source electrode connected with the data line and being in contact with the semiconductor layer, and a drain electrode facing the source electrode on the semiconductor layer;
    a pixel electrode connected with the TFT;
    a storage electrode connected with the common line, formed of a transparent conductive layer, and forming a storage capacitor with the pixel electrode, and
    a gate insulating layer formed on the common line and the gate line, insulating the semiconductor layer and the gate electrode of the TFT, and having a first contact hole exposing the common line, wherein the storage electrode is formed on the gate insulating layer and connected to the common line via the first contact hole, and wherein an insulating layer formed between the pixel electrode and the storage electrode; wherein the insulating layer covers the TFT and comprises a protection layer comprising a first layer made of an inorganic insulating material and formed on the source layer, and a second layer comprising an organic insulating layer and formed on the first layer; wherein the area of the storage electrode is smaller than that of the pixel electrode.

2. The substrate of claim 1, wherein the pixel electrode comprises a recess portion formed as a portion corresponding to the common line indented to be concave.

3. The substrate of claim 1, wherein the first contact hole exposes the common line and its peripheral insulation substrate, and the storage electrode is in contact with an upper surface and a side surface of the common line and the insulation substrate.

4. The substrate of claim 1, wherein the storage electrode and the data line are separated by more than 3 μm.

5. The substrate of claim 1, wherein the semiconductor layer comprises an active layer and an ohmic-contact layer, the ohmic-contact layer has the same planar shape as the data line, the source electrode, and the drain electrode, and remaining portions of the active layer other than the portion positioned between the source and drain electrodes have the same planar shape as the ohmic-contact layer.

6. The substrate of claim 1, wherein the first contact hole exposes a portion of an upper surface of the common line, and the storage electrode is in contact with only the portion of the upper surface of the common line.

7. The substrate of claim 1, wherein the storage electrode and the data line are separated by more than 3 μm.

8. The substrate of claim 1, wherein the semiconductor layer comprises an active layer and an ohmic-contact layer, the ohmic-contact layer has the same planar shape as the data line, the source electrode, and the drain electrode, and remaining portions of the active layer other than the portion positioned between the source and drain electrodes have the same planar shape as the ohmic-contact layer.

* * * * *